United States Patent [19]

Ward et al.

[11] 4,424,450

[45] Jan. 3, 1984

[54] HYBRID MOVING STAGE AND RASTERED ELECTRON BEAM LITHOGRAPHY SYSTEM EMPLOYING APPROXIMATE CORRECTION CIRCUIT

[75] Inventors: Billy W. Ward, Rockport; William D. Wells, Beverly, both of Mass.

[73] Assignee: Varian Associates, Inc., Palo Alto, Calif.

[21] Appl. No.: 299,681

[22] Filed: Sep. 8, 1981

[51] Int. Cl.³ .............................. H01J 77/00
[52] U.S. Cl. ................................ 250/492.2
[58] Field of Search ............... 250/311, 396 R, 492.2, 250/442.1

[56] References Cited

U.S. PATENT DOCUMENTS

| | | | |
|---|---|---|---|
| 3,706,905 | 12/1972 | Alexander | 315/21 CH |
| 3,900,737 | 8/1975 | Collier et al. | 250/492.2 |
| 4,362,942 | 12/1982 | Yasuda | 250/492.2 |

OTHER PUBLICATIONS

Asai et al, "Distortion Correction and Deflection Calibration by Means of Laser Interferometry in an Electron-Beam Exposure System," J. Vac. Sci. Technol., vol. 16, No. 6, Nov./Dec. 1979, p. 1710.

"Distortion Correction in Precision Cathode Ray Tube Display Systems", Published by Intronics Corp., 1970, pp. 1–14.

Primary Examiner—Bruce C. Anderson
Attorney, Agent, or Firm—Stanley Z. Cole; William R. McClellan

[57] ABSTRACT

A hybrid moving stage and scanning electron beam lithography system employs a circuit to make an approximate correction to the electron optical beam steering element. Correction is accomplished for observed, repetitive distortions. The position of the beam is thereby corrected for various modes of raster scan distortion. Field curvature distortion is corrected by a circuit which employs a term proportional to the square of the value of the scan direction coordinate. Keystone error is corrected by a circuit which employs a term proportional to the value of the coordinate orthogonal to the scan direction.

6 Claims, 11 Drawing Figures 4,424,450

HYBRID MOVING STAGE AND RASTERED ELECTRON BEAM LITHOGRAPHY SYSTEM EMPLOYING APPROXIMATE CORRECTION CIRCUIT

This invention relates to a hybrid moving stage and rastered electron beam lithography system and, more particularly, relates to a hybrid moving stage and rastered electron beam lithography system employing a circuit to make approximate corrections for non-linear beam traces.

Electron beam lithography systems are achieving widespread use for the fabrication of mask plates in the semiconductor industry. Such electron beam lithography machines have also begun to be used for writing directly onto wafers and such usage is expected to increase. Electron beam lithography machines comprise a central vacuum chamber which houses a source of electrons that are electromagnetically steered so they impinge upon a substrate such as a mask plate. The mask is coated with an electron sensitive resist on which a pattern is produced by the incident, steered electrons. Steering is accomplished by applying deflecting forces to the beam by means of electron optical elements such as electrostatic plates or electromagnets. In principle, the beam is either steered to the precise location where resist is to be exposed (vector beam scanning) or is rastered in a predetermined pattern and blanked to produce a pattern in the resist (raster beam scanning). The exposed pattern is then developed on the mask plate to produce a functional mask.

In a raster scan electron beam lithography system the pattern would be expected to be subject to distortion near the edges of the scan if the mask plate were flat. This distortion increases as the scan length is increased. The distortion makes the images at the edges appear to be stretched out compared to the images in the center. See, e.g., U.S. Pat. No. 3,706,905, J. F. Alexander, "Deflection Compensation System". In addition, geometric as well as electronic errors can produce characteristic shapes at the edges of the scan. These shapes include the following: barrel, trapezoidal, pin cushion and keystone. In order to avoid these problems, the state of the art raster scan electron beam lithography system, developed at the Bell Telephone Laboratories and designated EBES combined mechanical and electrical movement. Large movements are made mechanically by the stage on which the mask is mounted while smaller deflections are electrically introduced into the beam itself. The scan lines are thus of limited length and edge distortion is reduced or eliminated. In operation, the mechanical stage makes a slow linear movement to expose successive regions of a selected column on the mask or wafer. The deflection fields for each beam scan were kept down to 256 $\mu$m. Thus, at the edges of each scan there is little distortion even on a flat mask plate. See, e.g., D. R. Herriott, et al., "EBES: A Practical Electron Lithographic System", *IEEE Trans ED*-22, p. 385 (1975); see also, R. J. Collier, "Electron Beam Exposure System", U.S. Pat. No. 3,900,737 (1975). The rationale for this writing scheme has proved to be correct for low system writing rates. For example, see, e.g., R. A. Geshner, "The Electron Beam: A Better Way to Make Semiconductor Masks," *Solid State Technology*, June, 1979, 69, 71–72. However, in order to increase writing rates, the beams are being deflected faster and wider stripes are being utilized. This has led to the generation of distortions, particularly at the edge of the scans.

It is therefore an object of the present invention to provide a circuit for correcting raster scan distortions in a hybrid moving stage and rastered electron beam lithography system.

It is another object of the present invention to apply an approximate correction to the beam in a hybrid moving stage and rastered scan electron beam lithography that is a function of the observed deviations from a rectilinear scan.

BRIEF DESCRIPTION OF THE DRAWINGS

For a more complete understanding of the present invention, reference may be had to the accompanying drawings which are incorporated herein by reference and in which.

SUMMARY OF THE INVENTION

A hybrid moving stage and scanned electron beam lithography system employs a circuit to make an approximate correction to the electron optical element which steers the beam to produce the raster scan. Distortion of a given kind is observed and a circuit is designed to correct the observed distortion. The steering of the beam is thereby corrected so that the effects of the various modes of raster scan distortion, especially at the edges of the scan, are substantially reduced. For example, field curvature is corrected by a circuit which employs a term proportional to the square of the value of the scan direction coordinate and keystone error is corrected by a circuit which employs a term proportional to the value of the coordinate orthogonal to the scan direction.

DESCRIPTION OF THE PREFERRED EMBODIMENT

Distortions in the trace of the projected rays in raster scan electron beam lithography systems have various sources and have various characteristics. One source is geometric, e.g., due to the flatness of the mask plate the deflected beam does not maintain linearity over the scan length; the rays which are projected from a point source describe a sphere and the mask plate intercepts the sphere in a plane thereby introducing a nonlinearity in the trace of the ray. Another source is electronic, e.g., errors produced by noise or nonlinearity in the deflection circuitry. A third source of errors is mechanical, i.e., variations in the acceleration, deceleration and settling times of the moving stage. For the practice of the present invention it is not necessary to precisely identify the sources of error. Rather, as long as their characteristics are known, suitable corrections may be applied. For a particular machine the errors can be visually inspected under relevant operating conditions, and a correction term generated to produce an approximate correction. This correction term may then in turn be generated by an analog circuit or by software. The analog representation of the correction term is then superimposed upon the circuitry which drives the electron optical elements which steer the beam. The deflections imparted to the beam will then take into account the distortions at the extremity of scan. This approach is not a dynamic correction of the type disclosed in M. S. Michail, "Method and Apparatus for Positioning a Beam of Charged Particles", U.S. Pat. No. 3,900,736, but is premised upon observing characteristic errors and developing a fixed correction term. This generation and application of a fixed correction term has been determined to be appropriate for a hybrid moving stage and rastered electron beam system since the precise source of many observed errors cannot in any event be determined and since dynamic feedback information may not readily be used to alter the motion of the mechanical stage.

Figure 1:
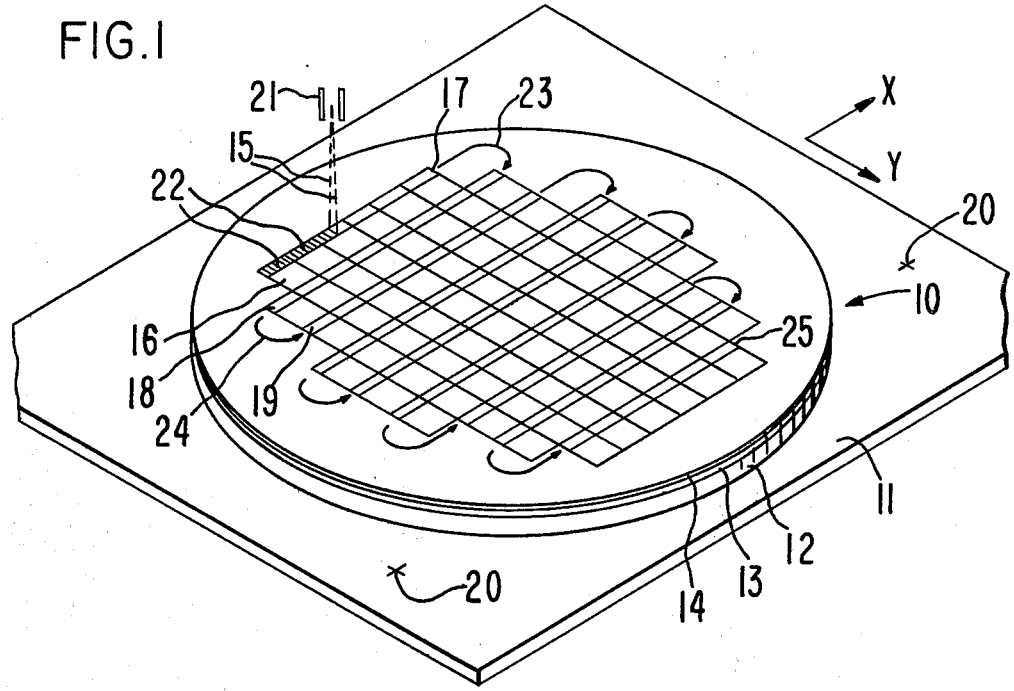
FIG. 1 is a pictorial view of a hybrid moving stage and raster scanned electron beam system in which a column is being exposed stripe by stripe.

The mechanical and electrical features of a hybrid moving stage and rastered electron beam lithography system are set out in detail in R. J. Collier, et al, "Electron Beam Exposure System", U.S. Pat. No. 3,900,737. The method of operation is set forth therein particularly at col. 4, lines 3 et. seq. Briefly, as shown in FIG. 1 of this specification, a mask plate 10 is placed on a moving table 11. Moving table 11 may be attached, for example, to orthogonal cylindrical air bearings to produce precision mechanical movement. Also, moving table 11 may comprise a mask plate holder such as disclosed in N. J. Guarino, "X-Y Work Table", U.S. Pat. No. 4,280,054. The mask plate 10 is composed of a glass plate 12 with an overlying layer 13 of chrome and a topmost layer of electron beam resist 14. A modulated electron beam 15 forming a spot about a 0.5 μm across is steered by electron optical elements 21 to scan in raster fashion across electron resist layer 14. Scan lines 22 are produced in succession to thereby write column 17 from bottom to top. In operation, the moving table 11 is in constant motion to present new, unwritten portions of column 17 to the steadily scanning modulated electron beam 15. When the top of column 17 is reached moving table 11 makes a shift as indicated by curved arrow 23 to begin the top-to-bottom writing of column 18. Then, when column 18 is finished moving table 11 makes another shift as indicated by curved arrow 24 to begin the bottom-to-top writing of column 19. This sequence is continued through column 25 until all the leftmost columns of the separate circuit regions 16 are written. Then, in the same serpentine fashion, the next to the left column is written in each of the separate circuit regions 16 which comprise individual integrated circuits. Scanning continues column-by-column until the total surface area of all separate circuit regions 16 has been scanned. The exposed portions of electron resist 14 are then developed, the underlying chrome is etched and the mask used to fabricate integrated circuits; in direct write e-beam systems, dopant atoms will typically be implanted directly into the regions defined by the development of the resist. The stability of electron beam 15 is tested by periodic examination of the position of fiducial marks 20.

As described above, when the length of the scan line was limited to 256 μm no appreciable distortion was discerned at the extremities of scan. As the length of scan lines was increased, however, positional errors at the extremities became discernible. These errors have various characteristics including: field curvature (also called scan bow) which is the curving of the field of scan at the end of the traverse along the y-axis or curving of the scan up or down at the extremities of the scan along the axis; distortions involving a rotation of the axis of scan; pincushion distortion produced on flat plates because the distance from the source of the beam to the plate varies with the deflection angle; and trapezoidal distortion resulting from the broadening or narrowing of the scan at one end of either the x- or y-axis. For a pictorial representation of some of these types of errors, see, e.g., FIG. 5 in R. A. Geshner, "The Electron Beam: A Better Way to Make Semiconductor Masks", *Solid State Technology*, June 1979, pp. 69, 72 or *Distortion Correction in Precision Cathode Ray Tube Display Systems*, Intronics Brochure (1970).

In EBES-type systems acceptable approximate corrections have been determined for certain ones of these distortion errors. These corrections could be applied to the stage that holds the mask or to the circuitry that drives the electron optical elements. In practice, however, the stage has a large mass and therefore a high inertia thereby producing a slow response to correction signals. Also, the stage has a settling time which renders it difficult to make the minute corrections required. Consequently, the approximate corrections are preferably superimposed upon the circuitry which drives the electron optical beam steering elements. The illustrative embodiments of the present invention, as described subsequently, employ a circuit which generates an analog representation of the appropriate approximate correction factor. This analog signal is applied to the circuitry which drives the electron optical elements. Alternatively, this correction signal may be generated by software.

Figure 2:
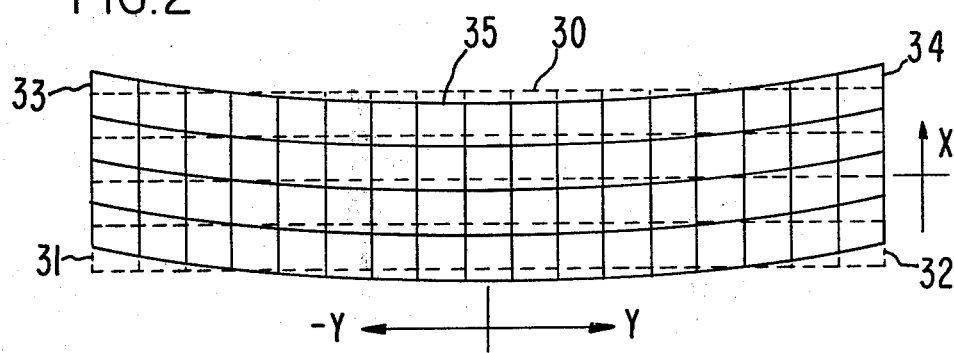
FIG. 2 shows x-axis field curvature (also called scan bow) by superimposing a series of electron beam scans (solid lines) on a matrix (dotted lines) made up of the desired locations for the scan lines.
Figure 6:
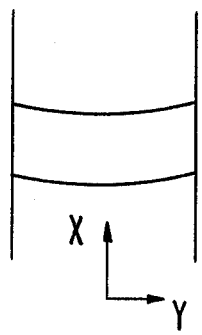
FIG. 6 is a pictorial representation of the x-axis field curvature of FIG. 2; bow.

Field curvature along the x-axis is shown in pictorial form in FIG. 6. The x-direction is the direction in which the pattern is being written up or down a given column. The y-direction is the direction of an individual line of scan. Necessarily, moving table 11 (FIG. 1) moves in a direction to continuously present new, unwritten area to be exposed. Thus, in FIG. 1 when column 17 is being written, moving table 11 moves in the negative x-direction. The beam 15 makes fine movements in the x-direction in conjunction with scanning movements in the y-direction, so that in concert with the gross movements of moving table 11 in the x-direction, horizontal traces 22 are produced. When column 18 is being written, moving table 11 moves in the positive x-direction. The y-direction (with y=o being the center line of a given column) is the desired direction of scan of the scanning beam 15. A perfect scanning pattern would be represented by a succession of horizontal lines which in the aggregate would form a rectangle wholly within the edge lines which define the column. Field curvature is a distortion whereby the edges of the scan assume a curved shape either up or down along the x-axis or at the end of scan along the y-axis. The curves are typically symmetrical, with the edges being either both up or both down in the x-direction or both right- or left-handed in the y-direction. An actual field curvature produced by a scanning electron beam is shown in FIG. 2. The matrix formed by dotted lines 30, 31, 32 represent the precise shape of a perfect scan while the solid lines 33, 34, 35 illustrate the actual traces made by a scanning electron beam. For the run of FIG. 2 the moving stage is locked down and the beam is steered to produce scans over its allowed range in x. The y axis is the center of the column and the x axis is the central horizontal dotted line. The solid squares are 28 μm (in x) by 29 μm (in y). Thus, the solid horizontal traces such as trace 35 represent one of every 56 traces since the spot size of the electron beam is 0.5 μm. It is evident that the field curvature is perpetuated as the scanning electron beam moves in the x-direction. An acceptable approximate correction factor to correct for this error has been found to be $$x = x_o \pm kY^2$$

where
   x=corrected position of the electron beam in direction up or down the column.
   $x_o$=uncorrected beam position in direction of the pattern.
   k=a constant
   y=distance from the center line of the column being scanned.

The sign of the correction term is positive if the curvature of the bow is down and is negative if the curvature of the bow is up. The value of the constant is determined by the severity of the curvature, i.e., the radius of the curvature. The correction factor is applied continually as the errors are found to be a function of the electronics, hardware and software of the EBES system and not dependent upon position on the wafer, upon the particular column or location of a line of scan within a given column. Only the location of the beam along a given scan line is relevant in determining the needed correction.

Figure 3:
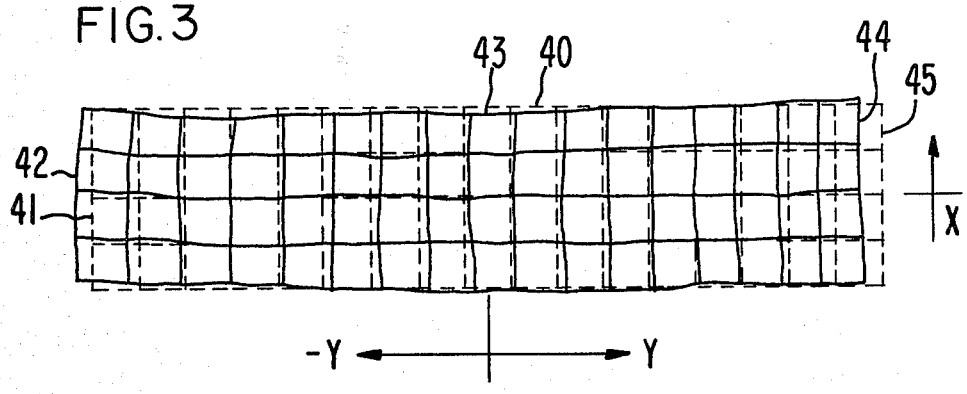
FIG. 3 shows y-axis field curvature by superimposing a series of electron beam scans (solid lines) on a matrix (dotted lines) made up of the desired locations for the scan lines.
Figure 7:
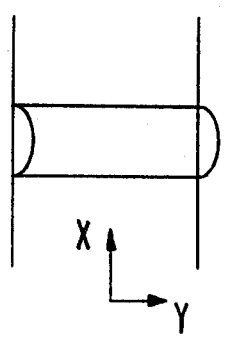
FIG. 7 is a pictorial representation of a y-axis field curvature having a mirror image relationship to the field curvature of FIG. 3.

Field curvature along the y-axis is shown in pictorial form in FIG. 7. This constitutes a shift of the electron beam spot over the edge of the column being written. Actual field curvature distortion to the left is shown in FIG. 3. The dotted line matrix 41, 40, 45 represents the desired position of the trace of the scanned electron beam. The solid lines 42, 43, 44 show the actual trace of the scanned electron beam as being shifted to the left. As before, the moving stage is locked down, the y axis is the center of the column and the x-axis is the central horizontal line. For the present invention it is not necessary to ascertain the source of this field curvature. Rather, in practicing the present invention the error is observed and the appropriate approximate correction term is applied. For field curvature the appropriate correction term has been found to be $$y = y_o \pm kx^2$$

y=corrected position of the electron beam in direction of the scan
where
   $y_o$=uncorrected position of the electron beam in direction of the scan
   k=a constant
   x=distance from the center of the deflection field.

It is important to correct for field curvature along the y-axis so that pattern features of adjacent columns butt up properly against each other.

Figure 8:
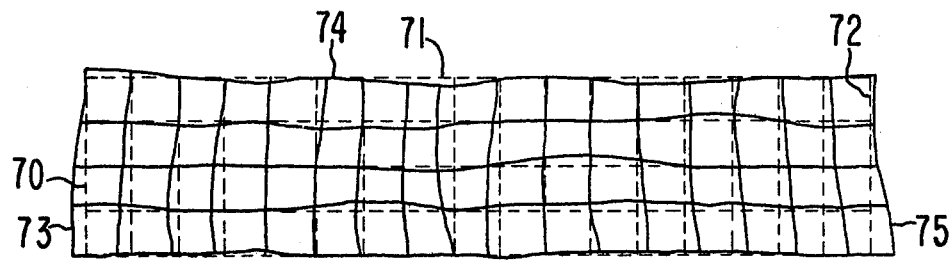
FIG. 8 shows one version of keystone error by superimposing a series of electron beam scans (solid lines) on a matrix (dotted lines) made up of the desired locations for the scan lines.

Keystone error of two types are shown in FIGS. 8–11. In FIG. 8 a keystone error in the shape of an upright trapezoid is depicted. The dotted line matrix 70, 71, 72 represents the desired position of the trace of the scanned electron beam. The solid lines 73, 74, 75 show the actual trace of the scanned electron beam or containing the aforesaid upright trapezoid. As previously, the moving stage is locked down, the y-axis is the center of the column and the x-axis is the central horizontal line. The shape of the error is shown pictorially in FIG. 10. To correct for this systematic error the appropriate correction term has been found to be $$x = x_o (\text{Gain})_x + \frac{x_o y}{k}$$

where
   x=corrected position of the electron beam in direction of the pattern
   $x_o$=uncorrected position of beam in direction of the pattern
   k=a constant
   $(\text{Gain})_x$=gain applied to electron optical deflection elements in the x-direction
   y=distance from the center line of the column being scanned.

Figure 9:
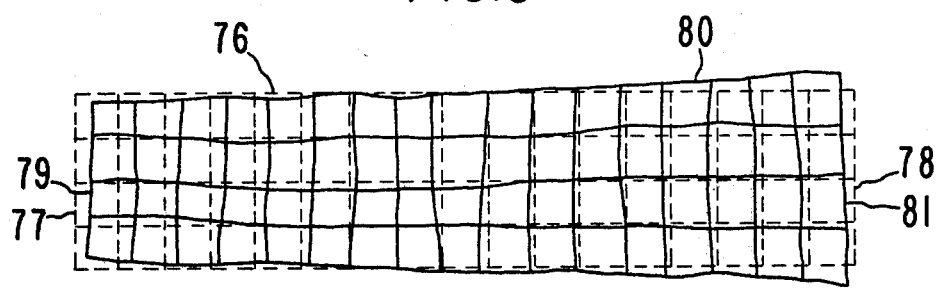
FIG. 9 shows another version of keystone error by superimposing a series of electron beam scans (solid lines) on a matrix (dotted lines) made up of the desired locations for the scan lines.
Figure 10:
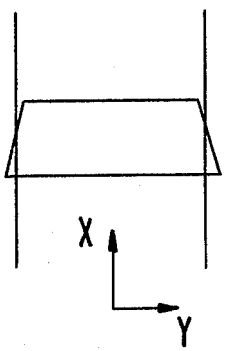
FIG. 10 is a pictorial representation of the keystone error of FIG. 8.
Figure 11:
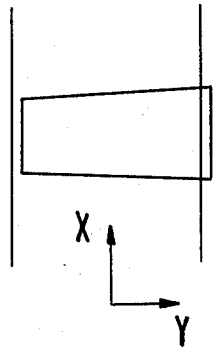
FIG. 11 is a pictorial representation of the keystone error of FIG. 9.

In FIG. 9 a keystone error in the shape of a trapezoid shifted to the right is depicted. The dotted line matrix 76, 77, 78 represents the desired position of the trace of the scanned electron beam. The solid lines 79, 80, 81 show the actual trace of the scanned electron beam as containing the aforesaid right shifted trapezoid. As previously, the moving stage is locked down, the y-axis is the center of the column and the x-axis is shown pictorially in FIG. 11. To correct for this systematic error the appropriate correction term has been found to be $$y = y_o (\text{Gain})_y + \frac{y_o x}{k}$$

where
   y=corrected position of the electron beam in the direction of the scan
   $y_o$=uncorrected position of the electron beam in the direction of the scan
   k=a constant
   $(\text{Gain})_y$=gain applied to electron optical deflection elements in the y-direction
   x=distance from the center of the deflection field.

The distortion errors of FIGS. 2 and 3 are approximately corrected by applying a correction term which is proportional to the square of the conjugate coordinate. The distortion errors of FIGS. 8–9 are approximately corrected by applying a correction term proportional to the gain of the electron optical deflection element and proportional to the conjugate coordinate. These correction terms are found to be suitable for the rastered, serpentine column scanning approach of the hybrid EBES system. This hybrid scheme has relatively narrow scan lengths and prescribed columnar travel. Thus, more precise correction terms such as that of the Intronics C-100 Correction Module are not required. See Intronics brochure, *Distortion Correction in Precision Cathode Ray Tube Display Systems*, p. 8. Other approximate correction factors are possible, for example, for correction of rotation.

Figure 4:
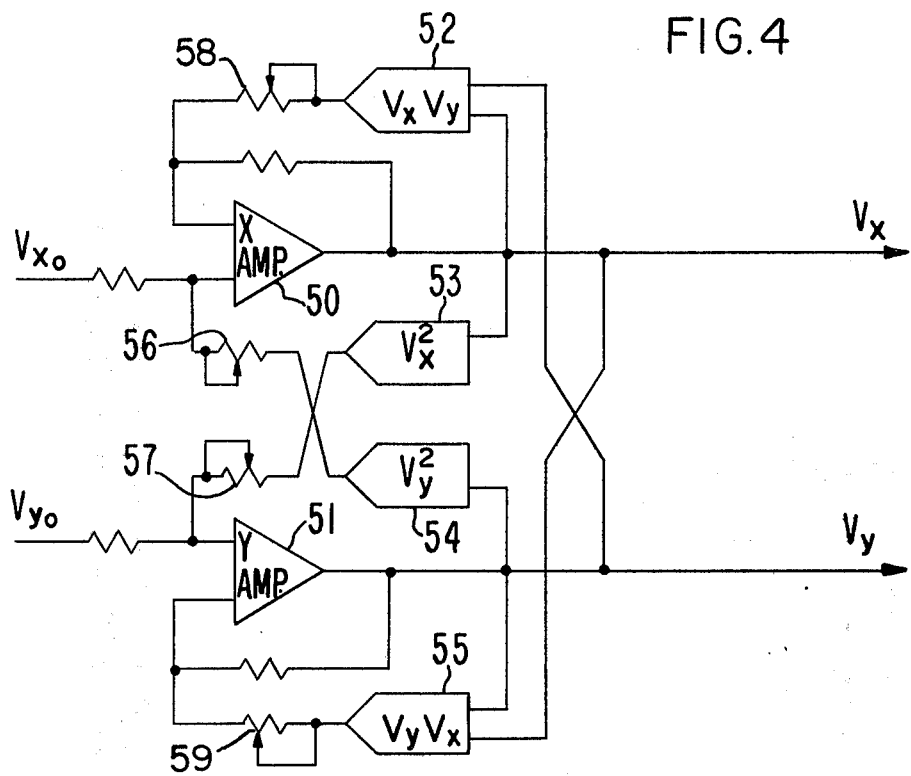
FIG. 4 is a schematic diagram of a circuit to implement the present invention.

A circuit for producing the correction of the field curvature errors of FIGS. 2-3 in accordance with the preceding description is illustrated in FIG. 4. The $V_{xo}$ and $V_{yo}$ voltages correspond, respectively, to the uncorrected positions for x, the direction of the pattern along the column and for y, the direction of the individual scan. Without correction these voltages are the ones which would be applied to the beam deflection electromagnet in the electron optical column. The values $V_x$ and $V_y$ are the corrected values which are in fact applied to the electron optical column. In operation, the $V_{xo}$ value is transformed to $V_x$ by the following steps. The value for $V_y$ is squared in circuit element 54 and multiplied by a constant by means of variable resistor 56. The values for $V_x$ and $V_y$ are multiplied in circuit element 52 and multiplied by a constant by means of variable resistor 58. Then, the squared value, $V_y^2$, and $V_x \times V_y$ are added to $V_{xo}$ through amplifier 50 to produce $V_x$. Similarly, $V_x$ is squared in circuit element 53 and multiplied by a constant through variable resistor 57. The values for $V_x$ and $V_y$ are multiplied in circuit element 55 and multiplied by a constant by means of variable resistor 59. The squared value, $V_x^2$, and $V_x \times V_y$ is then added to $V_{yo}$ through amplifier 51 to produce $V_y$.

Figure 5:
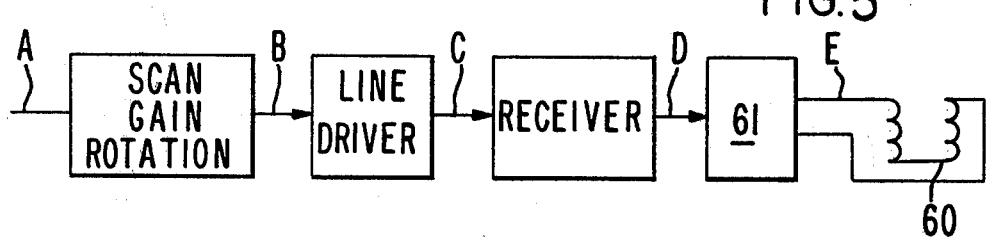
FIG. 5 is a block diagram illustrating the multiple points in a hybrid moving stage and scanned electron beam lithography system at which a circuit implementing the present invention may be utilized.

As shown in FIG. 5, a correction voltage may be applied in a hybrid moving stage and rastered electron beam lithography system at various locations in the circuitry which controls the electron optical steering elements. For example, the correction value may be applied in the form of a variable current source/sink at point E directly to the electromagnet 60. Alternatively, the correction factor may be applied as a variable voltage at point D as an input to deflection amplifier 61. In other versions, the correction factor could be applied at point C as a voltage correction to the receiver; at point B as a voltage correction to the line driver; or at a point A as a voltage correction to the scan gain circuit. The preferred point for application is point B as a variable voltage because all other corrections have been added at this point.

What is claimed is:

1. A hybrid moving stage and scanning electron beam lithography system, including within a vacuum chamber a source of electrons, an electron optical column for directing an electron beam towards a mask or wafer, a moving stage for mounting said mask or wafer to be exposed and means for generating uncorrected x and y analog voltages $V_{xo}$, $V_{yo}$ adapted for deflecting said electron beam over the surface of said mask or wafer, the improvement comprising:

a circuit for generating corrected x and y analog deflection voltages $V_x$, $V_y$ approximately corrected for raster scan errors, such as field curvature and trapezoidal errors by adding to incorrected voltage $V_{xo}$, $V_{yo}$ predetermined correction voltages which are derived from said uncorrected analog values of $V_{xo}$, $V_{yo}$.

2. A hybrid moving stage and scanning electron beam lithography system as defined in claim 1 wherein said corrected deflection voltages $V_x$, $V_y$ are corrected for field curvature in accordance with the formulas:

$$V_x = V_{xo} \pm K_1 V_y^2$$

$$V_y = V_{yo} \pm K_2 V_x^2$$

where $K_1$, $K_2$ = constants.

3. A hybrid moving stage and scanning electron beam lithography system as defined in claim 1 wherein said corrected deflection voltages $V_x$, $V_y$ are corrected for trapezoidal errors in accordance with the formulas:

$$V_x = V_{xo} \pm K_3 V_x V_y$$

$$V_y = V_{yo} \pm K_4 V_x V_y$$

where $K_3$, $K_4$ = constants.

4. A hybrid moving stage and scanning electron beam lithography system as defined in claim 1 wherein said corrected deflection voltages $V_x$, $V_y$ are corrected for trapezoidal errors and field curvature in accordance with the formulas:

$$V_x = V_{xo} \pm K_1 V_y^2 \pm K_3 V_x V_y$$

$$V_y = V_{yo} \pm K_2 V_x^2 \pm K_4 V_x V_y$$

where $K_1$, $K_2$, $K_3$, $K_4$ = constants.

5. A hybrid moving stage and scanning electron beam lithography system as defined in claim 2 wherein said circuit comprises an x summing amplifier which receives an input $V_{xo}$ and provides an output $V_x$, a y summing amplifier which receives an input $V_{yo}$ and provides an output $V_y$, a first squaring circuit having an input coupled to the output $V_y$ of said y summing amplifier and an output coupled to an input of said x summing amplifier and a second squaring circuit having an input coupled to the output $V_x$ of said x summing amplifier and an output coupled to an input of said y summing amplifier.

6. A hybrid moving stage and scanning electron beam lithography system as defined in claim 3 wherein said circuit comprises an x summing amplifier which receives an input $V_{xo}$ and provides an output $V_x$, a y summing amplifier which receives an input $V_{yo}$ and provides an output $V_y$, a first multiplier circuit having inputs coupled to the outputs $V_x$ and $V_y$ of said summing amplifiers and an output coupled to an input of said x summing amplifier and a second multiplier circuit having inputs coupled to the outputs $V_x$ and $V_y$ of said summing amplifiers and an output coupled to an input of said y summing amplifier.

* * * * *